US012598990B2

(12) United States Patent
Bhatt et al.

(10) Patent No.: US 12,598,990 B2
(45) Date of Patent: Apr. 7, 2026

(54) ELECTRICALLY ISOLATED DISCRETE PACKAGE WITH HIGH PERFORMANCE CERAMIC SUBSTRATE

(71) Applicant: Littelfuse, Inc., Chicago, IL (US)

(72) Inventors: Aalok Bhatt, Bremen (DE); Francois Perraud, Bremen (DE); Cynthia Selke, Bremen (DE); Rhodri Hughes, Wilts (GB); Tiburcio Maldo, Batangas (PH)

(73) Assignee: Littelfuse, Inc., Rosemont, IL (US)

( * ) Notice: Subject to any disclaimer, the term of this patent is extended or adjusted under 35 U.S.C. 154(b) by 291 days.

(21) Appl. No.: 18/141,118

(22) Filed: Apr. 28, 2023

(65) Prior Publication Data

US 2024/0363478 A1    Oct. 31, 2024

(51) Int. Cl.
   *H01L 23/373*       (2006.01)
   *H01L 23/31*        (2006.01)

(52) U.S. Cl.
   CPC ...... *H01L 23/3735* (2013.01); *H01L 23/3107* (2013.01)

(58) Field of Classification Search
   CPC ............. H01L 23/3735; H01L 23/3107; H01L 23/49562; H01L 23/15; H01L 23/367; H01L 23/3731; H01L 23/49811; H01L 23/49838; H01L 23/49568; H01L 23/13; H01L 23/142; H01L 2924/13033; H01L 2924/13034; H01L 2924/13091; H10D 62/8325; H10D 62/8503
   See application file for complete search history.

(56) References Cited

U.S. PATENT DOCUMENTS

| | | | | |
|---|---|---|---|---|
| 6,404,065 | B1 | 6/2002 | Choi | |
| 2008/0054417 | A1* | 3/2008 | Lee | ..................... H01L 23/4334 |
| | | | | 257/E23.092 |
| 2019/0103342 | A1* | 4/2019 | Neugirg | ................. H01L 24/49 |
| 2022/0238426 | A1* | 7/2022 | Seal | .................... H01L 23/3121 |
| 2022/0254700 | A1 | 8/2022 | Kim | |

FOREIGN PATENT DOCUMENTS

| | | | |
|---|---|---|---|
| EP | 2365522 | A1 | 9/2011 |
| KR | 100849914 | B1 | 8/2008 |
| KR | 1020220125079 | A | 9/2022 |
| TW | 200830524 | A | 7/2008 |
| TW | 201310603 | A | 3/2013 |
| TW | 201523819 | A | 6/2015 |
| WO | 0007238 | A1 | 2/2000 |

OTHER PUBLICATIONS

Extended European Search Report for EP Application No. 24171372.6, dated Oct. 1, 2024, 8 pages.

* cited by examiner

*Primary Examiner* — Patricia D Valenzuela
(74) *Attorney, Agent, or Firm* — KDW Firm PLLC

(57) ABSTRACT

A substrate package arrangement may include a substrate that contains a ceramic body, a top metal layer, disposed on a top side of the ceramic body, and a bottom metal layer, disposed on a bottom side of the ceramic body, opposite the top surface. The substrate package arrangement may further include a lead structure, electrically connected to the top metal layer, and being electrically isolated from the bottom metal layer, wherein the substrate and lead structure are arranged in a discrete package, and wherein the ceramic body is formed of a high thermal conductivity material.

18 Claims, 7 Drawing Sheets

100N

100G

100K

100E

100F

100J

100L

100M

100I

100D

100H

ELECTRICALLY ISOLATED DISCRETE PACKAGE WITH HIGH PERFORMANCE CERAMIC SUBSTRATE

BACKGROUND

Field

Embodiments relate to the field of semiconductor devices, and in particular, discrete power semiconductor device.

Discussion of Related Art

Modern power semiconductor devices are formed in semiconductor die (chips) with different technologies such as silicon-controlled rectifiers ("SCRs"), power transistors, insulated gate-bipolar transistors ("IGBTs"), metal-oxide-semiconductor field effect transistors ("MOSFETs"), bipolar power rectifiers, diodes, Triacs, and most recently, devices fabricated using the wide band gap semiconductor materials such as Silicon Carbide (SiC), Gallium Nitride (GaN) or combinations thereof. The semiconductor chips may be assembled in discrete power packages that include substrates that provides electrical isolation between the discrete power device mounting tab and the metal heat-sink. The heat-sink is generally used as a cooling medium on which the power semiconductor device can be mounted for cooling. These substrates may be encapsulated via mold compound that provides various connections to outside components. Such a housing/substrate/semiconductor die assembly may be referred to as a discrete power semiconductor device (also referred to herein as "discrete power devices"). The role of such a substrate in a power semiconductor device may be to provide integrated electrical isolation to the heat sink, interconnections from semiconductor die components to other components in a power semiconductor discrete device, as well as for thermal management of heat generated by the semiconductor die. The substrates are electrically isolated but thermally conductive.

Most of the discrete power semiconductor packages (also referred to herein as "non isolated discrete power devices") have an electrically conductive mounting tab. It is typically desired to electrically isolate the device mounting tab from the metal heat sink due to safety concerns and the need to mount multiple discrete devices on the same heatsink frame. Therefore, the employment of an external thermally conductive isolation method between the non-isolated discrete semiconductor package and the heatsink has become widely used approach in the industry for such a purpose. However, there are major penalties involved with the external isolation method, including increased thermal resistance between semiconductor device junction and the heatsink, reduced power and current handling capability, and complex thermal management, as well as significant assembly efforts, and compromises. Discrete packages may be arranged in isolated or non-isolated configurations. A non-isolated package, using a copper plate material is able to provide relatively higher current carrying capability. A disadvantage of a non-isolated configuration is that the package does not provide electrical isolation and the usage of external isolation lead to major penalties as cited above. The isolated packages are able to provide integrated isolation by means of a ceramic substrate, and thus an external isolation method is no longer required, leading to better overall thermal resistance from junction to heatsink, improved power and current density. To provide isolation within isolated packages, a ceramic substrate such as aluminum oxide (Al$_2$O$_3$), is sandwiched between two different copper sheets, thus providing the ability to provide electrical isolation. The stack of copper, aluminum oxide and copper is popularly known as Direct Bonded Copper (DBC) (and also known alternatively "DCB") in the industry. In practice, an Aluminum oxide ceramic is the most cost effective ceramic option and is widely used in both module type packages and discrete packages.

When a DBC substrate is configured for use in discrete isolated packages, such Al$_2$O$_3$ substrates exhibit substantially lower current and power density capability as compared to their discrete non-isolated counterparts, based upon a single copper plate. Notably, such relatively lower current/power capability afforded by a discrete, isolated package may be adequate for many applications, such as in lower power electronics. Thus, the DBC substrates provide a useful compromise that affords electrical isolation and sufficient current/power capabilities for many uses. However, the reduced current/power capability of these known discrete/isolated packages may limit their performance in the case of wide band gap power semiconductors, such as SiC (Silicon carbide) and GaN (Gallium nitride), where the power and current density capability are of prime importance.

In view of the above, the present embodiments of the present disclosure are provided.

BRIEF SUMMARY

In one embodiment, a substrate package arrangement is provided. The substrate package arrangement may include a substrate that contains a ceramic body, a top metal layer, disposed on a top side of the ceramic body, and a bottom metal layer, disposed on a bottom side of the ceramic body, opposite the top surface. The substrate package arrangement may further include a lead structure, electrically connected to the top metal layer, and being electrically isolated from the bottom metal layer, wherein the substrate and lead structure are arranged in a discrete package, and wherein the ceramic body is formed of a high thermal conductivity material.

In another embodiment, a semiconductor device package may include a substrate that has a ceramic body, a top metal layer, disposed on a top side of the ceramic body, and a bottom metal layer, disposed on a bottom side of the ceramic body, opposite the top surface. The semiconductor device package may also include a lead structure, electrically connected to the top metal layer, and electrically isolated from the bottom metal layer, and a housing, extending around the substrate. As such, the substrate, housing, and lead structure may be arranged in a discrete package, wherein the ceramic body is formed of a high thermal conductivity material.

In another embodiment, an isolated, discrete semiconductor device package is provided, which package may include a substrate that includes a ceramic body, a top metal layer, disposed on a top surface of the ceramic body, and a bottom metal layer, disposed on a bottom surface of the ceramic body, opposite the top surface. The isolated, discrete semiconductor device package may also include a power SiC semiconductor die, disposed on the top metal layer, a lead structure, electrically connected to the top metal layer, and electrically isolated from the bottom metal layer, as well as a housing, extending around the substrate. As such, the substrate, housing, and lead structure may be arranged in a discrete package, wherein the top metal layer and the bottom metal layer are connected to the ceramic body by an intermediate layer, and wherein the ceramic body is formed of a high thermal conductivity material.

DESCRIPTION OF EMBODIMENTS

Figure 1A:
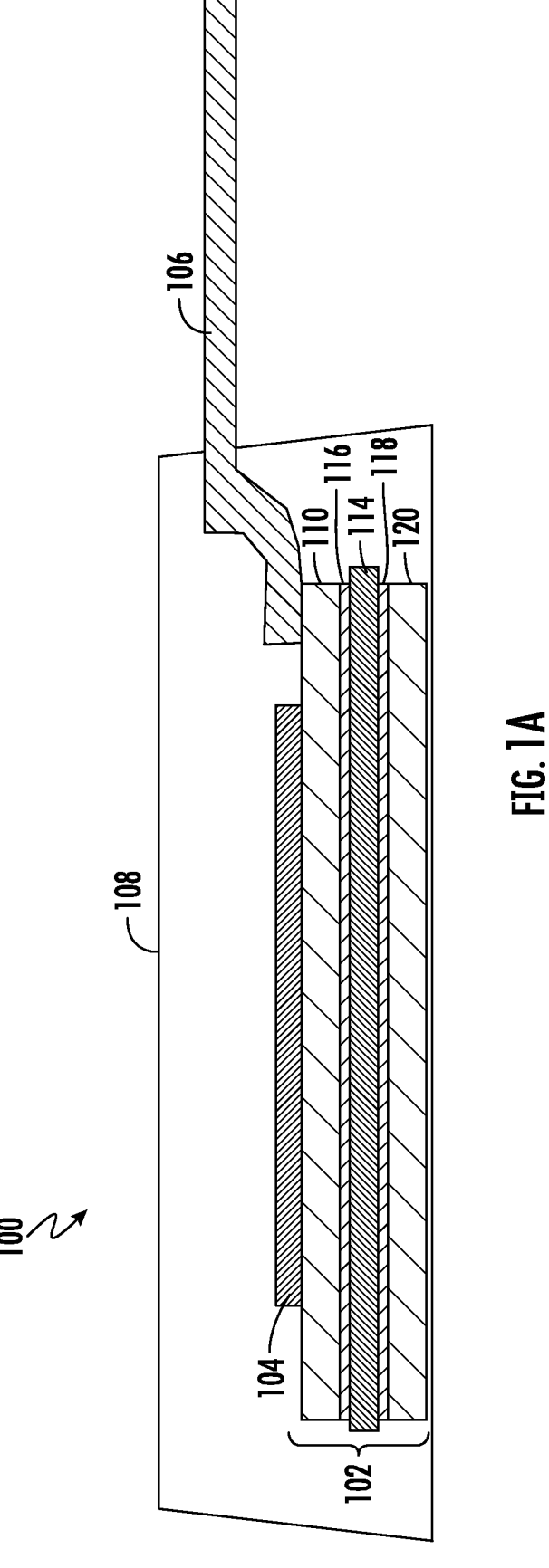
FIG. 1A shows a side view of a discrete semiconductor device package, according to embodiments of the disclosure.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

The present embodiments, as describe herein below, are designed to improve the performance of discrete semiconductor device packages, in particular, for discrete power semiconductor packages, such as electrically isolated ("isolated") discrete packages based upon a ceramic substrate. Non-limiting examples of power semiconductors suitable for the present embodiments include SiC, GaN, and silicon-based power semiconductor devices. According to various embodiments as detailed herein, an isolated discrete package may be based upon a high performance ceramic substrate that that is based upon a high thermal conductivity material, where 'high thermal conductivity' as used herein may refer to a thermal conductivity of greater than 40 W/mK. Advantages of this approach are set forth in the embodiments to follow. In various embodiments, a high thermal conductivity ceramic body may be attached to a metal layer formed on top and bottom of the ceramic body by any suitable metallization process or sequence of processes, including brazing, active metal brazing (AMB), brazing filler material (BFM), sputtering, firing, pasting, application of heat and pressure to thicker metal sheet, or other known metallization process.

FIG. 1A shows a side view of a discrete semiconductor device package, referred to herein as package 100, according to embodiments of the disclosure.

Figure 1B:
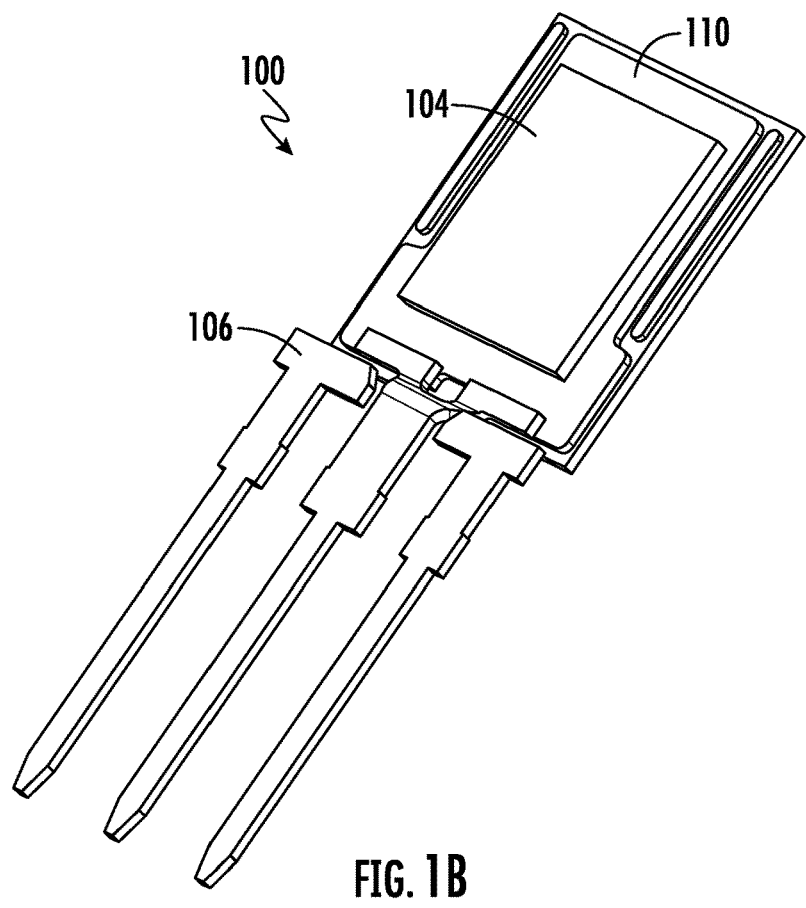
FIG. 1B shows a top isometric view of the discrete semiconductor device package of FIG. 1A, according to embodiments of the disclosure.

FIG. 1B shows a top isometric view of the semiconductor device package of FIG. 1A, according to embodiments of the disclosure. The package 100 may be generally arranged as an electrically isolated discrete package. Known examples of an electrically isolated discrete packages include packages that employ so-called DBC substrates, where the DBC substrate is based upon an $Al_2O_3$ (the term "$Al_2O_3$" and the term "aluminum oxide" may be used interchangeably herein, unless otherwise noted) substrate that is sandwiched between two sheets of copper. In the embodiment of FIG. 1A and FIG. 1B, the package 100 includes a substrate 102, lead structure 106, electrically connected to the substrate 102, semiconductor die 104, disposed on the substrate 102, and a housing 108, extending around the substrate 102.

In the present embodiments, the substrate 102 may include a ceramic body 114, a top metal layer 110, disposed on a top side of the ceramic body 114, a bottom metal layer 120, disposed on a bottom side of the ceramic body 114, opposite the top surface. According to various embodiments of the disclosure, the top metal layer 110 and the bottom metal layer 120 are connected to the ceramic body 114 via an intermediate layer 116 and 118. Note that the intermediate layer may be formed on each main side of the ceramic body 114. The intermediate layer(s) is shown as intermediate layer 116, joining the top side of ceramic body 114 to top metal layer 110, and intermediate layer 118, joining ceramic body 114 to bottom metal layer 120. In some embodiments, the intermediate layer 116 and intermediate layer 118 may be active metal braze layers formed by a known active metal braze process. In other embodiments, the intermediate layer 116 and intermediate layer 116 may be formed by sputtering or other suitable process. The embodiments are not limited in this context.

In accordance with various embodiments of the disclosure, the ceramic body 114 may be formed of a high thermal conductivity substrate, such as silicon nitride ($Si_3N_4$) or aluminum nitride (AlN). According to some non-limiting embodiments, the thickness of the ceramic body 114 may be less than 0.7 mm. The intermediate layer 116 and intermediate layer 118 may be formed of known materials, including Ag, Cu, Ti, W, combinations thereof, and other components. The joining of the ceramic body 114 to top metal layer 110 and bottom metal layer 120, via an active metal braze process or other known process, including, but not limited to, DBC process, diffusion bonding, firing, sputtering, and so forth. In various non-limiting embodiments, the thickness of the intermediate layers 116, 118 may range from 3 μm to 50 μm or more, and may be deposited upon the ceramic body 114 before joining to the top metal layer 110 and bottom metal layer 120. Suitable approaches for forming the intermediate layers 116, 118 include screen printing and sputtering, or other known techniques, according to various non-limiting embodiments.

In accordance with various embodiments of the disclosure, top metal layer 110 and the bottom metal layer 120 are formed of copper. Likewise, the lead structure 106 may be formed of a copper material, including copper alloys. In other embodiments, the lead structure 106 may be formed of other electrically conductive material.

A hallmark of the package 100 is that the package 100 represents an electrically isolated, discrete package. A used herein, a "discrete package" may refer to a semiconductor device package having just one ceramic substrate contained therein, and may be characterized by a relatively smaller planar area, such as less than 2000 mm$^2$, or less than 1800 mm$^2$. In some embodiments, just one power semiconductor die may be arranged in the discrete package, or just one power semiconductor die plus an accompanying diode die (not shown in FIG. 1A). In other embodiments of a "discrete package" multiple die from different technology (not shown in FIG. 1A), including up to six die or so may be arranged in the discrete package, with the proviso that the discrete package includes just one ceramic substrate, and conforms to an area of less than 2000 mm$^2$. Some embodiments of discrete packages may be fabricated according to through hole technology or surface mount technology (SMT) types. Such discrete packages will not have screw mounting pins or press fit pins, and can be mounted on printed circuit board (PCB) via know methods such as reflow or wave soldering.

Figure 1C:
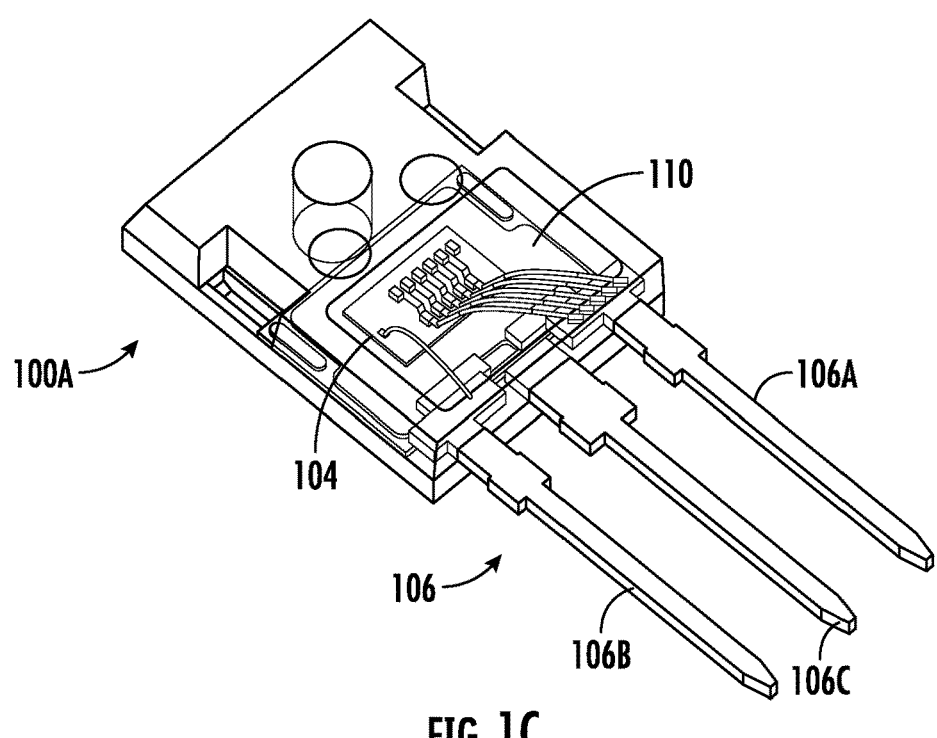
FIG. 1C shows a top isometric view of a variant of the discrete semiconductor device package of FIG. 1B, according to embodiments of the disclosure.
Figures 1D, 1E, 1F, 1G, 1H, 1I, 1J, 1K, 1L, 1M, 1N:
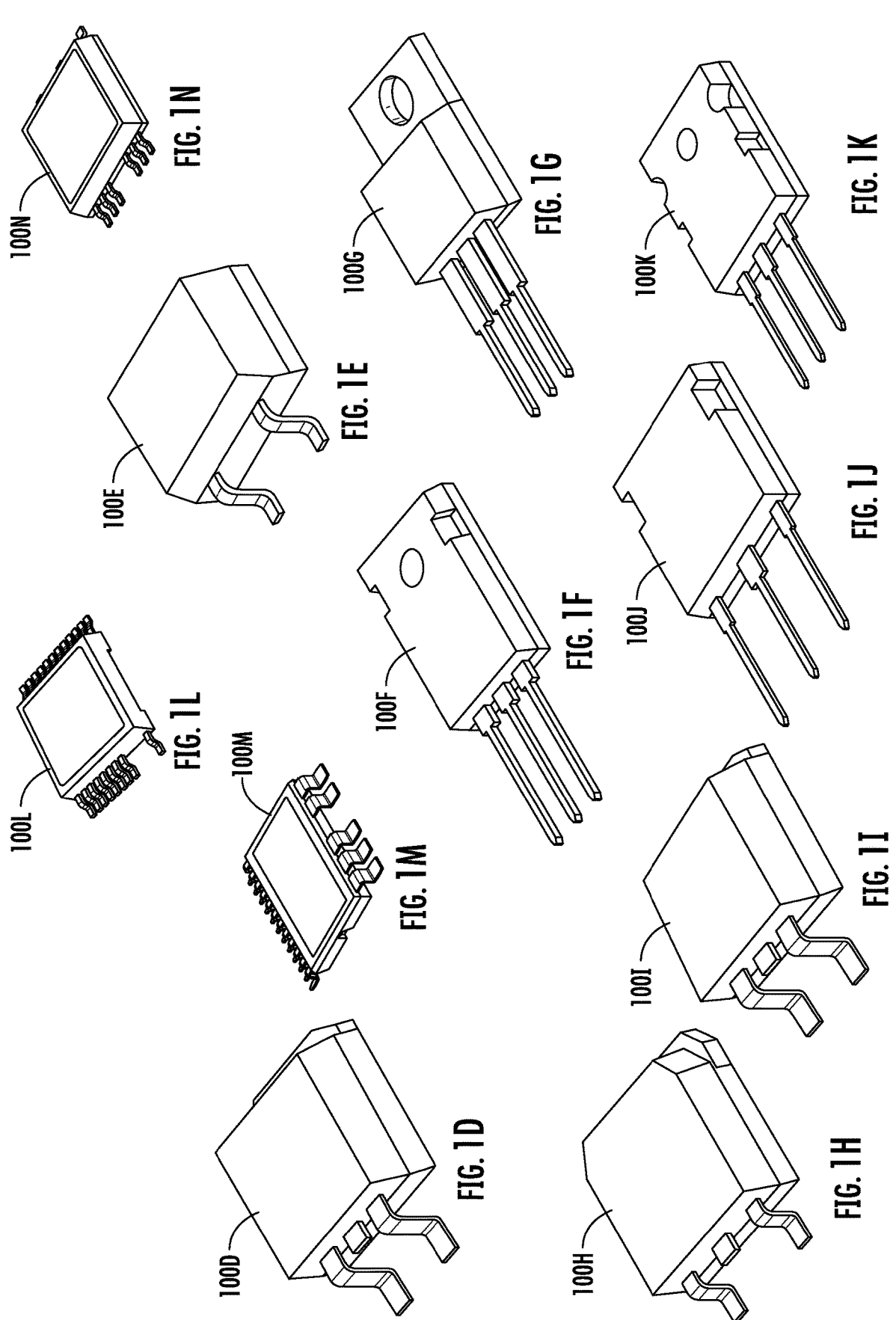
FIG. 1D, FIG. 1E, FIG. 1F, FIG. 1G, FIG. 1H, FIG. 1I, FIG. 1J, FIG. 1K, FIG. 1L, and FIG. 1M, and FIG. 1N depict isometric views of discrete semiconductor device packages according to other embodiments of the disclosure.

FIG. 1C shows a top isometric view of a variant of the discrete semiconductor device package of FIG. 1B, according to embodiments of the disclosure. In this example, the package 100A is configured similarly to package 100, with like parts labeled the same. In this embodiment, the semiconductor die 104 is a power semiconductor die, where a first lead 106A is connected to a top surface of the semiconductor die 104 to form contact with a main terminal of the semiconductor die 104 (not separately shown). A second lead 106B is provided to form contact to a gate terminal on the top surface of the semiconductor die 104, in the case of a device such as an IGBT, MOSFET, Thyristor, etc. A third lead 106C is connected to the top metal layer 110 to form a second main terminal contact to a second terminal of the semiconductor die 104 that is formed on the bottom surface (not visible) of the semiconductor die (104).

The embodiments of FIG. 1A, FIG. 1B, and FIG. 1C provides various advantages over known electrically isolated, discrete packages. Some of these advantages are illustrated with respect to the figures to follow. As noted previously, DBC substrates are widely deployed for discrete packages (as well as in multi-die packages). These DBC substrates provide the benefit of electrical isolation and adequate current/power capability for semiconductor devices, arranged in a relatively smaller form factor package. While FIG. 1B depicts one package shape, FIG. 1D, FIG. 1E, FIG. 1F, FIG. 1G, FIG. 1H, FIG. 1I, FIG. 1J, and FIG. 1K, FIG. 1L, FIG. 1M, and FIG. 1N depict isometric views of discrete semiconductor device packages 100D, 100E, 100F, 100G. 100H, 100I, 100J, and 100K, 100L, 100M, and 100N respectively, according to other embodiments of the disclosure. According to various non-limiting embodiments, a high performance ceramic substrate may be implemented in isolated discrete packages such as ISO and ISOPLUS® family of packages, including ISO247, ISOPLUS247, ISO264, ISOPLUS264, ISOPLUS220, ISOPLUSi4PAC, ISOPLUS SMPD (surface mounted power device), and ISOPLUS DIL packages. (ISOPLUS is a registered trademark of IXYS, LLC, which is owned by Littelfuse, Inc.) In additional non-limiting embodiments, a high performance ceramic substrate may be implemented in any other discrete package format.

Figure 2:
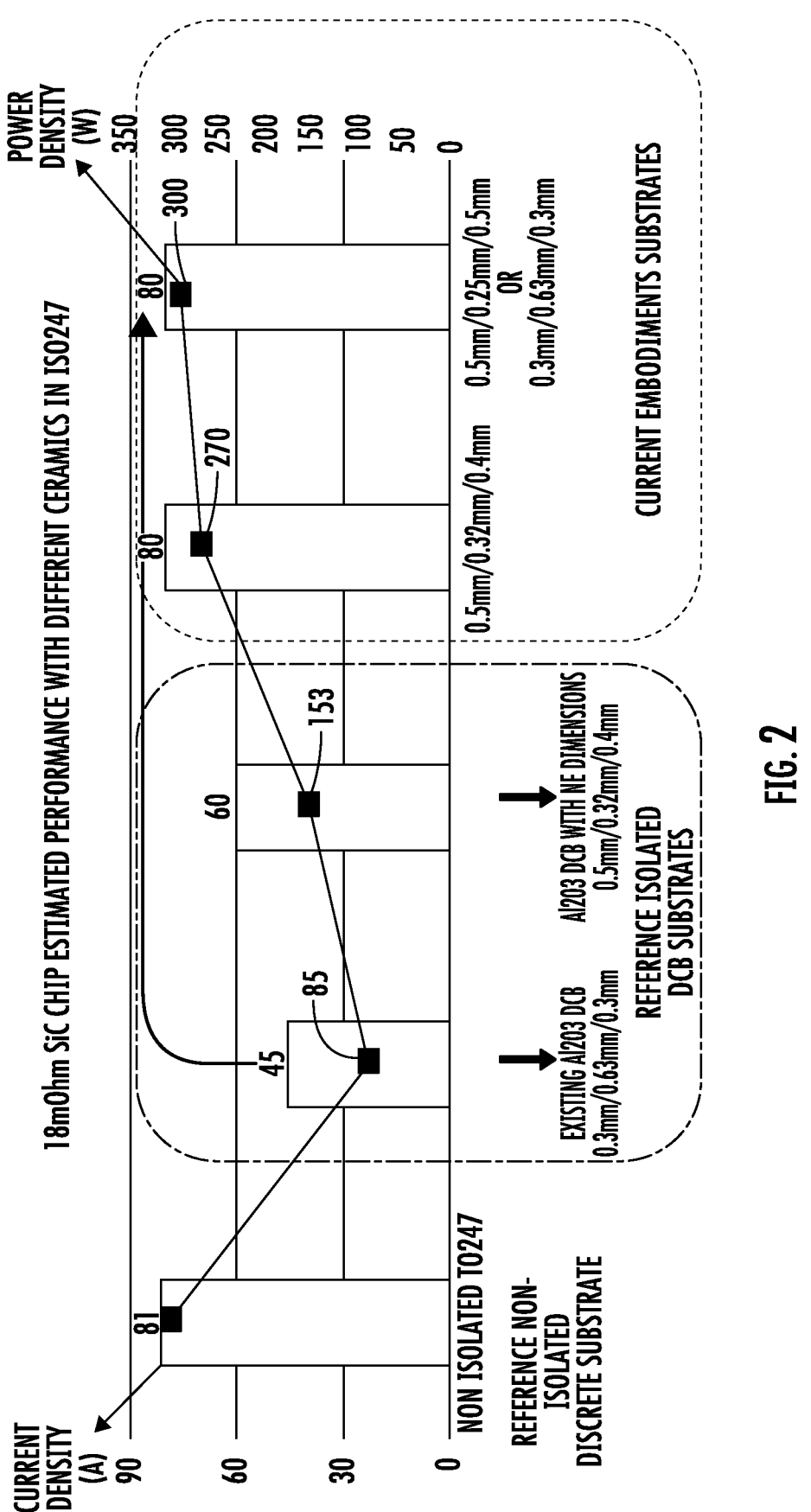
FIG. 2 presents a comparison of semiconductor current and power capability of different semiconductor substrate package arrangements.

Turning now to FIG. 2 there is shown a comparison of semiconductor current and power capability of different semiconductor substrate discrete package. The left-most axis represents current in Amperes while the right most axis represents power in Watts. In the example of FIG. 2, the performance of five different discrete packages is shown. Each of these discrete package is based upon the TO247 standard as set forth by the Joint Electron Device Engineering Council Solid State Technology Association (JEDEC). Exemplary characteristics of a TO247 package include planar dimensions of 21 mm×16 mm, with a package height of 5 mm. The current and power capability are shown for the five different discretes based upon a single 18 mOhm SiC semiconductor die mounted on a given substrate. The left-most example represents a non-isolated discrete package where the metal substrate supports a relatively higher current (81 A) and relatively higher power (312 W) without an external isolation method.

By way of comparison, the next-to-left-most example represents a reference isolated discrete package based upon a DBC substrate, where the ceramic $Al_2O_3$ body has a thickness of 0.63 mm and is sandwiched by a top layer of 0.3 mm Cu and a bottom layer of 0.3 mm Cu. The advantage provided by the reference isolated discrete package is that electrical isolation is provided, albeit at the expense of a reduced current capability (45 A) and reduced power capability (85 W) in comparison to the non-isolated discrete package.

By way of further comparison, the middle example of FIG. 2 represents a reference isolated discrete package based upon a DBC substrate, where the ceramic $Al_2O_3$ body has a thickness of 0.32 mm and is sandwiched by a top layer of 0.5 mm Cu and a bottom layer of 0.4 mm Cu. In this case, the current capability increases to 60 A, while the power capability increases to 153 W. However, the isolated DBC substrate based upon the thinner 0.32 mm alumina substrate, when packaged in a TO247 package, still does not approach the current or power capabilities of the non-isolated counterpart.

The present inventors have discovered that, by using a higher performance ceramic substrate, such as a substrate based upon a high thermal conductivity material, including a silicon nitride ceramic or an Aluminum Nitride ceramic body, the current and power capabilities may be significantly enhanced in a TO247-based package, providing an electrically isolated, discrete package that is suitable for high power applications. In the example of FIG. 2, second to right-most, the current and power capabilities are shown for a semiconductor device package according to the present embodiments. This package is based upon an AMB substrate that has a 0.32 mm-thick silicon nitride ceramic body, having a top copper layer of 0.5 mm thickness and a bottom copper layer thickness of 0.4 mm thickness. Thus, the second-to right-most example matches the dimensions of the middle example of FIG. 2, which example is based upon an $Al_2O_3$ DBC substrate. As illustrated, with respect to the $Al_2O_3$ DBC substrate, the current capability increases to 80 A, nearly matching the current afforded in the non-isolated device. In addition, the power capability also increases to 270 W.

In the right-most example of FIG. 2, the current and power capabilities are shown for a semiconductor device package according to the present embodiments, for an AMB substrate, based upon a 0.25 mm thick silicon nitride ceramic body, having a top copper layer of 0.5 mm thickness and a bottom copper layer thickness of 0.5 mm thickness. The right-most example is also representative of the current and power capabilities of a 0.63 mm thick aluminum Nitride ceramic body having top and bottom copper layer of 0.3 mm thickness. Thus, the overall thickness of this substrate is approximately the same as the middle sample and the second-to-right-most sample. The current capability remains at the level of 80 A, while the power capability increases still further, to 300 W, nearly matching the power afforded in the non-isolated device. Thus, unexpectedly, an electrically isolated substrate has been identified that provides in a discrete package, a matching current and power capability in comparison to a non-isolated device.

Figure 3A:
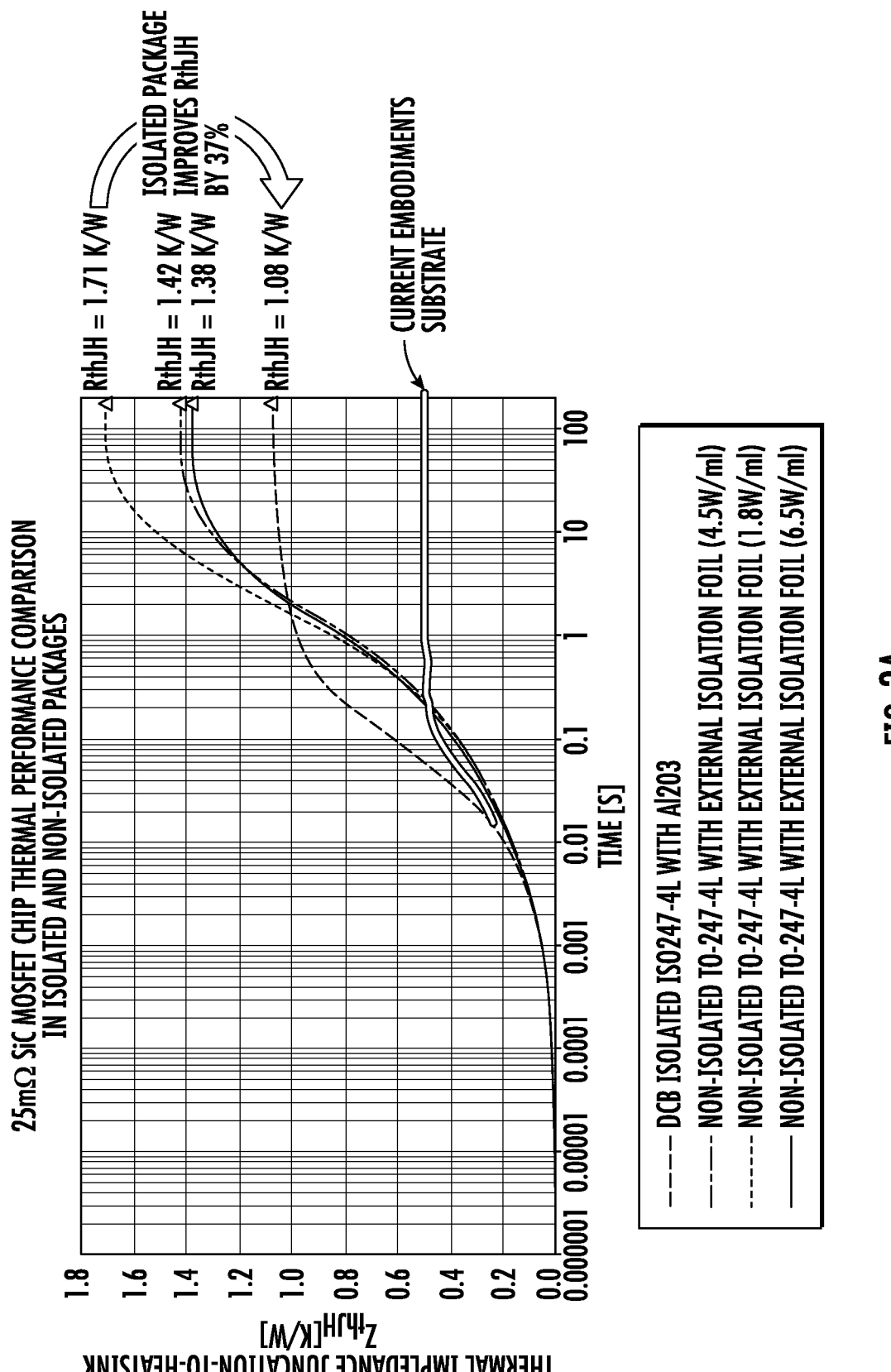
FIG. 3A presents a comparison of thermal impedance data of different semiconductor substrate package arrangements.

FIG. 3A presents a comparison of measured thermal impedance data of different semiconductor substrate package arrangements. The thermal impedance is shown for the five different device based upon a single 25 mOhm SiC MOSFET die mounted on a given substrate in a TO247-type package. The values to the right of the graph represent the steady state thermal impedance. The top three curves are for non-isolated packages with external isolation method, while the curve, fourth from the top is for a DBC-based package. The DBC-based package includes a 0.63 mm $Al_2O_3$ ceramic body sandwiched between two copper layers, each having a thickness of 0.3 mm.

Note that in this example the non-isolated packages have higher thermal impedance, and implicitly lower current and power capability. While in principle non-isolated packages may provide higher current and power capability, the need for external isolation may actually severely restrict the current and power capability as in the examples of FIG. 3A, In spite of these disadvantages, the non-isolated package has met widespread use. As a result, the known DBC-based isolated package actually substantially lowers thermal impedance as compared to the non-isolated examples.

The lowest curve in FIG. 3A represents the simulated behavior of an isolated AMB package arranged according to the present embodiments, using an AMB substrate with a $Si_3N_4$ ceramic body. In this example, the AMB substrate includes a 0.32 mm $Si_3N_4$ ceramic body sandwiched between two copper layers, each having a thickness of 0.5 mm top and 0.4 mm bottom layer respectively. The results exhibit a 54% reduction in thermal impedance for the AMB package as compared to the known $Al_2O_3$ DBC package. These results of FIG. 3A are supported by further experimental measurements performed by the present inventors as depicted in FIG. 3B, where an AMB substrate with a $Si_3N_4$ ceramic body with 0.3 mm Cu/0.32 mm $Al_2O_3$/0.3 mm Cu exhibited a 30% reduction in thermal impedance as compared to an $Al_2O_3$ DBC substrate with a 0.3 mm Cu/0.38 mm $Si_3N_4$/0.3 mm Cu, for the case of a different form factor discrete isolated package so called SMPD package.

Figure 3B:
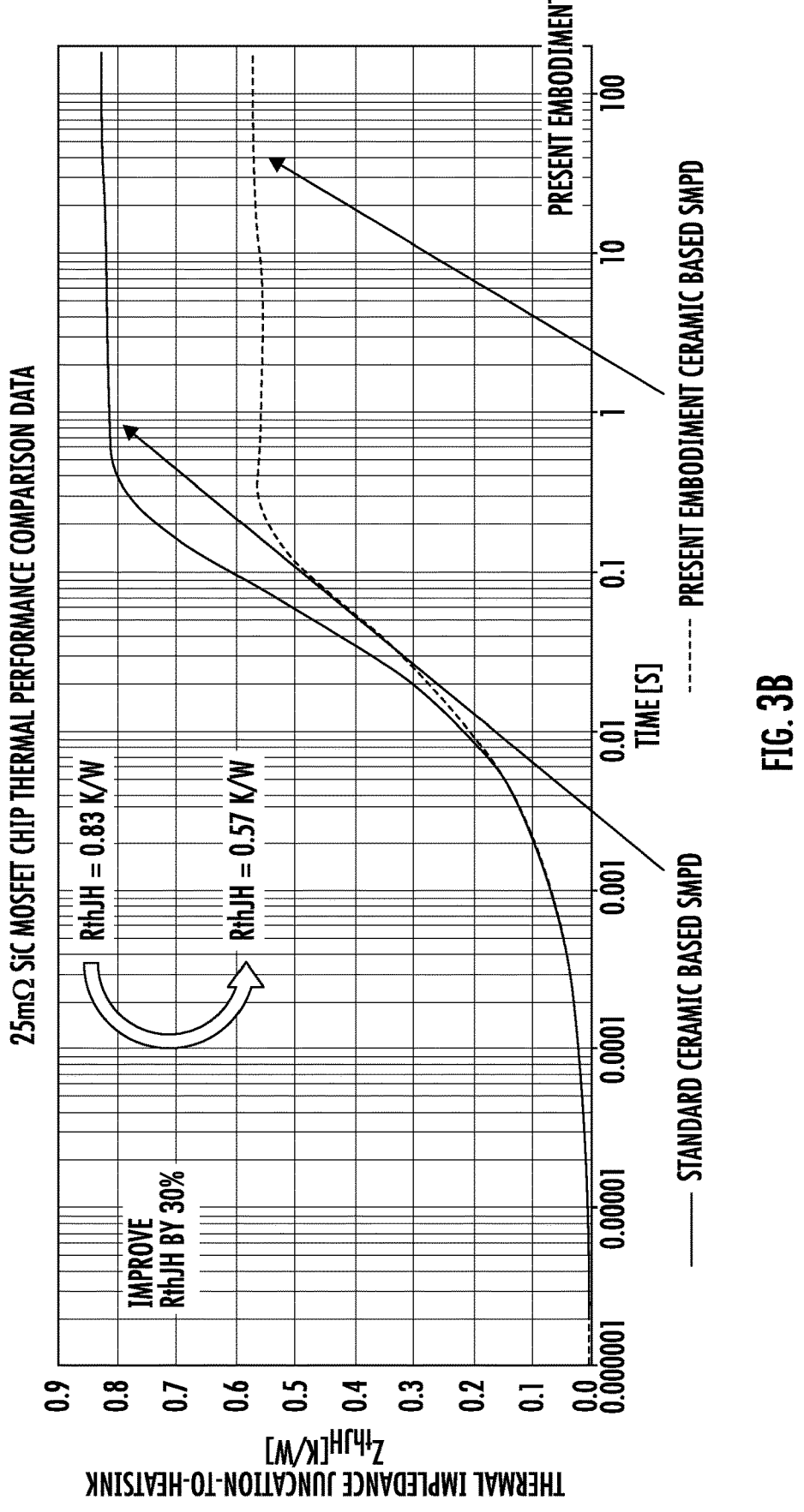
FIG. 3B presents a comparison of thermal impedance data of different semiconductor substrate package arrangements.
Figure 3C:
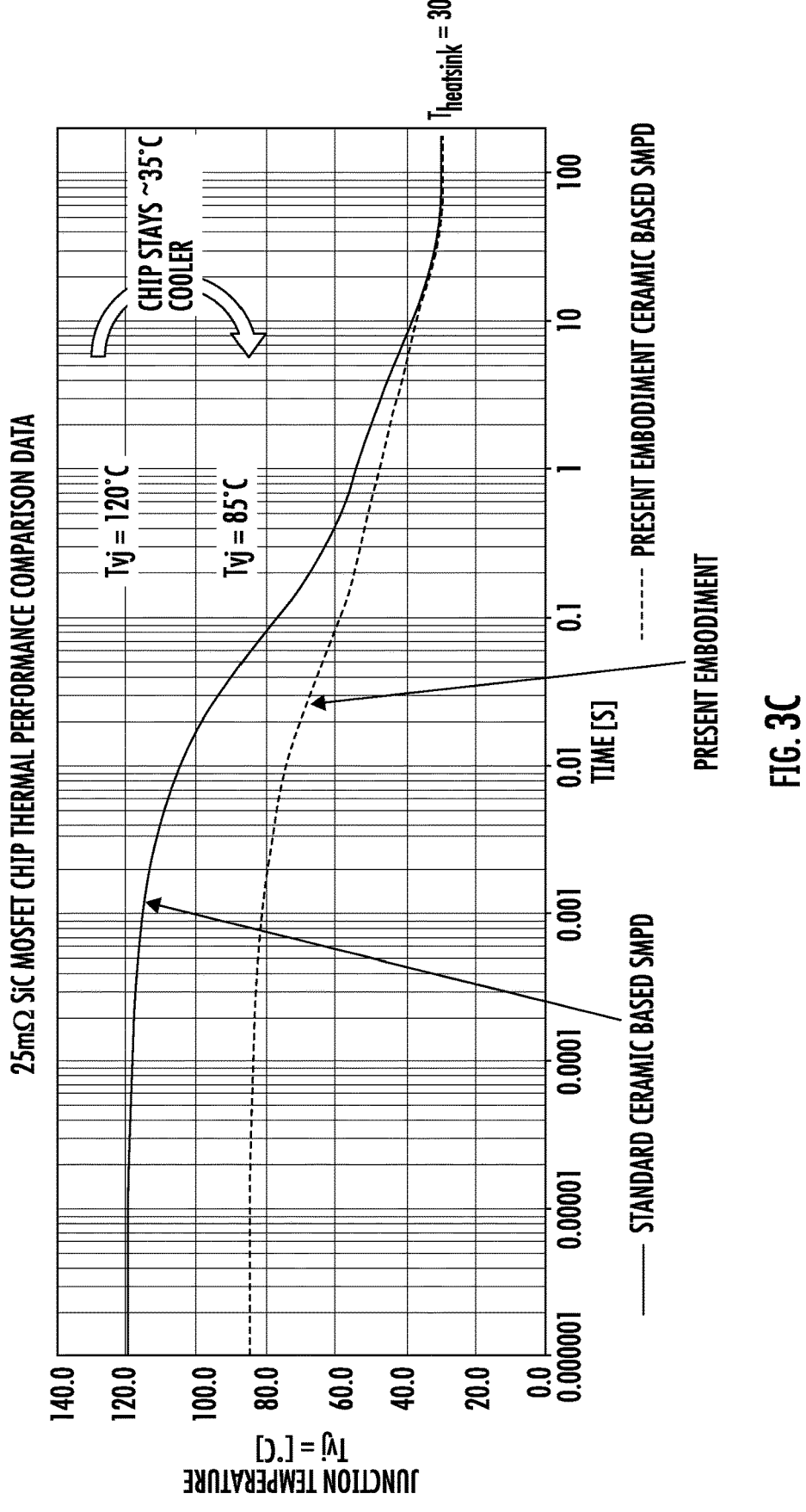
FIG. 3C presents a comparison of semiconductor chip junction temperature data of different semiconductor substrate package arrangements.

FIG. 3B presents a comparison of thermal impedance data of different semiconductor substrate package arrangements; and FIG. 3C presents a comparison of semiconductor chip junction temperature data of different semiconductor substrate package arrangements. As illustrated in FIG. 3B, the thermal impedance of a known a 25 mOhm SiC chip disposed on a known DBC aluminum oxide substrate is 0.83 K/W, while the thermal impedance of a SMPD package based upon a 25 mOhm SiC chip disposed on a $Si_3N_4$ substrate arranged according to the present embodiments is 0.57 K/W.

Comparing the same two packages of FIG. 3B, in FIG. 3C, the junction temperature in the SiC chip remains 35° C.

cooler in the package using $Si_3N_4$ substrate arranged according to the present embodiments, as compared to the known package using $Al_2O_3$. Accordingly, these results illustrate that application power may be increased up to 24% using the using $Si_3N_4$ substrate arranged according to the present embodiments, using the same package and SiC chip (die). Similar or even higher power increases should be obtained using similar high performance ceramic substrates, meaning those substrates based upon a ceramic body of high thermal conductivity as defined herein.

While some of the aforementioned embodiments focus on discrete, isolated, packages that include an AMB substrate based upon $Si_3N_4$ ceramic body, other embodiments may employ an AMB substrate based upon an AlN ceramic body and copper material for top and bottom layers. By way of comparison AlN ceramic material may exhibit a thermal conductivity in the range of 180 W/mK at room temperature, while $Si_3N_4$ ceramic exhibits a room temperature thermal conductivity approximately 85 W/mK, while $Al_2O_3$ may exhibit a value of 24-29 W/mK. Moreover, in addition to AMB substrates, the present embodiments cover $Si_3N_4$ or AlN substrates bonded to a metal top or bottom layer via a thin metal seed layer. For example, the thin metal seed layer may be deposited by sputtering, while the thicker metal (top and bottom) layers may also be deposited by sputtering. Suitable materials for such metal layers may include Cu, Al, W, Ti, Ni, Ag, and Au, according to some non-limiting embodiments, while suitable thickness for the top and bottom thicker metal layers is up to 1 mm or less, and in some embodiments 0.7 mm or less. In some embodiments, the metallization of these substrates may be prepared according to known commercial processes. More generally, and without limitation, the present embodiments cover isolated discrete power semiconductor packages based upon $Si_3N_4$ or AlN substrates, or any other high performance ceramic substrate, with metal top and bottom layers, where the metallization takes place by any suitable method or sequence of methods including brazing, sputtering, firing, pasting, application of heat and pressure to thicker metal sheet, or other known metallization process.

Moreover, while some examples disclosed herein are based upon packages based upon the TO247 standard, various additional non-limiting embodiments may be realized in other known or completely new discrete package configurations, such as those packages generally depicted at FIGS. 1D-1N, including the TO264 standard, the TO220 standard, and other configurations.

In summary, the present embodiments provide several advantages in terms of better current capability performance in discrete isolated packages as compared to non-isolated packages. In addition, the use of an isolated package avoids the need for expensive foils needed for external isolation, as well as additional mounting efforts and special tooling. The isolated discrete packages of the present embodiments also avoid the potential thermal conductivity deterioration over time that may accompany the use of isolation foils for non-isolated packages. Moreover, the present embodiments provide substantial improvement over known discrete isolation packages such as packages using DBC substrates.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments and may have the full scope defined by the language of the following claims, and equivalents thereof.

What is claimed is:

1. A substrate package arrangement, comprising:
a substrate, the substrate comprising:
   a ceramic body;
   a top metal layer, disposed on a top side of the ceramic body; and
   a first intermediate layer disposed between the top side of the ceramic body and the top metal layer;
   a bottom metal layer, disposed on a bottom side of the ceramic body, opposite the top side;
   a second intermediate layer disposed between the bottom side of the ceramic body and the bottom metal layer; and
a lead structure, electrically connected to the top metal layer, and being electrically isolated from the bottom metal layer;
a power semiconductor die disposed on the top metal layer,
wherein the substrate and lead structure are arranged in a discrete package, and wherein the ceramic body is formed of a high thermal conductivity material.

2. The substrate package arrangement of claim 1, wherein the top metal layer and the bottom metal layer are formed of copper.

3. The substrate package arrangement of claim 1, wherein the ceramic body is formed of silicon nitride or aluminum nitride.

4. The substrate package arrangement of claim 1, wherein the top metal layer and the bottom metal layer are connected to the ceramic body by an active metal braze layer.

5. The substrate package arrangement of claim 1, wherein the power semiconductor die comprises a silicon-controlled rectifier, power transistor, insulated gate-bipolar transistors, metal-oxide-semiconductor field effect transistor, bipolar power rectifier, diode, or TRIAC.

6. The substrate package arrangement of claim 1, wherein just one substrate is contained in the substrate package arrangement.

7. The substrate package arrangement of claim 1, wherein the power semiconductor die is a SiC die, GaN die or power silicon die.

8. The substrate package arrangement of claim 1, wherein the ceramic body has a thickness of 1 mm or less.

9. The substrate package arrangement of claim 1, wherein the substrate package arrangement has a set of dimensions in accordance with TO247, TO220, or TO264 standards as specified by Joint Electron Device Engineering Council Solid State Technology Association.

10. A semiconductor device package, comprising:
a substrate, the substrate comprising:
   a ceramic body;
   a top metal layer, disposed on a top side of the ceramic body;
   a first intermediate layer disposed between the top side of the ceramic body and the top metal layer;
   a bottom metal layer, disposed on a bottom side of the ceramic body, opposite the top side;
   a second intermediate layer disposed between the bottom side of the ceramic body and the bottom metal layer; and a lead structure, electrically connected to the top metal layer, and being electrically isolated from the bottom metal layer;
a power semiconductor die disposed on the top metal layer; and
a housing, extending around the substrate,
wherein the substrate, the housing, the power semiconductor die, and the lead structure are arranged in a discrete package, and wherein the ceramic body is formed of a high thermal conductivity material.

11. The semiconductor device package of claim 10, wherein the top metal layer and the bottom metal layer are formed of copper.

12. The semiconductor device package of claim 10, wherein the ceramic body is formed of silicon nitride or aluminum nitride.

13. The semiconductor device package of claim 10, wherein the power semiconductor die comprises a silicon-controlled rectifier, power transistor, insulated gate-bipolar transistors, metal-oxide-semiconductor field effect transistor, bipolar power rectifier, diode, power regulator, or TRIAC.

14. The semiconductor device package of claim 10, wherein just one semiconductor die is disposed on the top metal layer.

15. The semiconductor device package of claim 10, wherein the power semiconductor die is a SiC die, GaN die, or silicon die.

16. The semiconductor device package of claim 10, wherein the top metal layer and the bottom metal layer are connected to the ceramic body by an active metal braze layer.

17. The semiconductor device package of claim 10, wherein the semiconductor device package has a set of dimensions in accordance with TO247, TO220, or TO264 standards as specified by Joint Electron Device Engineering Council Solid State Technology Association.

18. An isolated, discrete semiconductor device package, comprising:
a substrate, the substrate comprising:
   a ceramic body;
   a top metal layer, disposed on a top side of the ceramic body; and
   a first intermediate layer disposed between the top side of the ceramic body and the top metal layer;
   a bottom metal layer, disposed on a bottom side of the ceramic body, opposite the top side;
   a second intermediate layer disposed between the bottom side of the ceramic body and the bottom metal layer; and
a power SiC semiconductor die disposed on the top metal layer;
a lead structure, electrically connected to the top metal layer, and being electrically isolated from the bottom metal layer; and
a housing, extending around the substrate,
wherein the substrate, housing, the power SiC semiconductor die, and the lead structure are arranged in a discrete package, wherein the ceramic body is formed of a high thermal conductivity material.

* * * * *